(12) United States Patent
Shiu et al.

(10) Patent No.: US 11,960,814 B2
(45) Date of Patent: Apr. 16, 2024

(54) WAFER SEARCHING METHOD AND DEVICE

(71) Applicant: Powerchip Semiconductor Manufacturing Corporation, Hsinchu (TW)

(72) Inventors: Jr-Rung Shiu, Hsinchu (TW); Ching-Ly Yueh, Hsinchu (TW); Pao-Ju Pao, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 486 days.

(21) Appl. No.: 17/463,562

(22) Filed: Sep. 1, 2021

(65) Prior Publication Data

US 2022/0414312 A1 Dec. 29, 2022

(30) Foreign Application Priority Data

Jun. 23, 2021 (TW) ................................ 110122947

(51) Int. Cl.
*G06F 30/398* (2020.01)
*H01L 21/66* (2006.01)

(52) U.S. Cl.
CPC ............ *G06F 30/398* (2020.01); *H01L 22/12* (2013.01)

(58) Field of Classification Search
None
See application file for complete search history.

(56) References Cited

U.S. PATENT DOCUMENTS

| 11,422,712 | B2* | 8/2022 | Yoshimizu | ........... G06F 12/1009 |
| 2010/0189339 | A1 | 7/2010 | Amanullah et al. | |
| 2011/0264404 | A1* | 10/2011 | Yanai | ..................... G03F 7/7065 |
| | | | | 702/150 |
| 2015/0037914 | A1* | 2/2015 | Takahashi | ............... H01L 22/14 |
| | | | | 438/15 |

FOREIGN PATENT DOCUMENTS

| TW | I483216 | 5/2015 |
| TW | 201727518 | 8/2017 |
| TW | 201830464 | 8/2018 |
| TW | I714371 | 12/2020 |

OTHER PUBLICATIONS

"Office Action of Taiwan Counterpart Application", dated Apr. 28, 2022, p. 1-p. 16.

* cited by examiner

*Primary Examiner* — Brian Ngo
(74) *Attorney, Agent, or Firm* — JCIPRNET

(57) ABSTRACT

The disclosure provides a wafer searching method and device. The method includes: obtaining a target wafer and a reference wafer; determining a first specific area in the target wafer, and obtaining a first significant distribution feature of the first specific area; determining a second specific area in the reference wafer, and obtaining a second significant distribution feature of the second specific area; in response to determining that the first significant distribution feature corresponds to the second significant distribution feature, estimating a fail pattern similarity between the first specific area and the second specific area; in response to determining that the fail pattern similarity is greater than a threshold, providing the reference wafer as a search result corresponding to the target wafer.

16 Claims, 6 Drawing Sheets

WAFER SEARCHING METHOD AND DEVICE

CROSS-REFERENCE TO RELATED APPLICATION

This application claims the priority benefit of Taiwan application serial no. 110122947, filed on Jun. 23, 2021. The entirety of the above-mentioned patent application is hereby incorporated by reference herein and made a part of this specification.

BACKGROUND

Technology Field

The disclosure relates to a searching method and a device, and more particularly to a wafer searching method and a device.

Description of Related Art

In the prior art, when a user wants to search for another wafer with die fail patterns similar to that of a certain target wafer in the database, it is mostly done by visual determination of the user, or by drawing a specific area in the target wafer so that the search system can compare it with other wafers in the database.

Referring to FIG. 1A, FIG. 1A is a schematic view of a conventional wafer comparison mechanism. In FIG. 1A, if the user selects a wafer 101 as the target wafer, the user can draw a specific area 101a in the wafer 101, and the search system can search for another specific area of another wafer in the database corresponding to the specific area 101a. For example, a specific area 102a of a wafer 102 and a specific area 103a of a wafer 103. Next, the search system can estimate the die fail ratio (e.g., 62% as shown) in the specific area 101a and estimate the die fail ratio in the specific area of another wafer, such as 60% of the specific area 102a and 59% of the specific area 103a. After the die fail ratio in the specific area of another wafer is obtained, the search system can identify the corresponding wafers (e.g., the wafers 102 and 103) whose die fail ratio of another specific area is close to that of the specific area 101a as a search result corresponding to the wafer 101.

However, the method have shortcomings at least as follows: (1) when the die fail pattern in the considered target wafer is special, it requires efforts for the user to set an appropriate specific area, and this process is time-consuming and not accurate; (2) after the target wafer is selected, the search system starts to obtain the die level data of another wafer, so it takes a lot of time; (3) when only a specific area is considered and other areas are not considered, it is easy to select a wafer with a wide range of fail patterns as the search result corresponding to the target wafer; (4) since it is the die level data that is considered, when the size, shape, and total number of each wafer are different, it is impossible to carry out cross-product comparison.

Referring to FIG. 1B, FIG. 1B is a schematic view of die level data of two wafers. In FIG. 1B, the horizontal axis and the vertical axis of a wafer 104 include 38 dies and 44 dies, respectively, and the horizontal axis and the vertical axis of a wafer 105 include 287 dies and 8 dies, respectively. In this case, cross-production comparison cannot be performed on the wafers 104 and 105 due to the difference in their size, shape, and total number.

SUMMARY

In view of this, the disclosure provides a wafer searching method and a device capable of solving the technical problems.

The disclosure provides a wafer searching method adapted for a wafer searching device. The method includes the following steps. A target wafer and a reference wafer are obtained. A plurality of failed dies and a plurality of normal dies are distributed on the target wafer and the reference wafer, respectively. The target wafer is divided into a plurality of first areas, and the reference wafer is divided into a plurality of second areas corresponding to the first areas. A first specific area in the first areas is determined, and a first significant distribution feature of fail patterns of the failed dies in the first specific area is obtained. At least one second specific area in the second areas is determined, and a second significant distribution feature of fail patterns of the failed dies in each second specific area is obtained. In response to determining that the first significant distribution feature corresponds to any one of the second significant distribution features of the at least one second specific area, a fail pattern similarity between the first specific area and the each second specific area is estimated. In response to determining that the fail pattern similarity is greater than a similarity threshold, the reference wafer is provided as a search result corresponding to the target wafer.

The disclosure provides a wafer searching device including a storage circuit and a processor. The storage circuit stores a program code. The processor is coupled to the storage circuit and accesses the program code for executing the following. A target wafer and a reference wafer are obtained. A plurality of failed dies and a plurality of normal dies are distributed on the target wafer and the reference wafer, respectively. The target wafer is divided into a plurality of first areas, and the reference wafer is divided into a plurality of second areas corresponding to the first areas. A first specific area in the first areas is determined, and a first significant distribution feature of fail patterns of the failed dies in the first specific area is obtained. At least one second specific area in the second areas is determined, and a second significant distribution feature of fail patterns of the failed dies in each second specific area is obtained. In response to determining that the first significant distribution feature corresponds to any one of the second significant distribution features of the at least one second specific area, a fail pattern similarity between the first specific area and the each second specific area is estimated. In response to determining that the fail pattern similarity is greater than a similarity threshold, the reference wafer is provided as a search result corresponding to the target wafer.

DESCRIPTION OF THE EMBODIMENTS

Figure 1A:
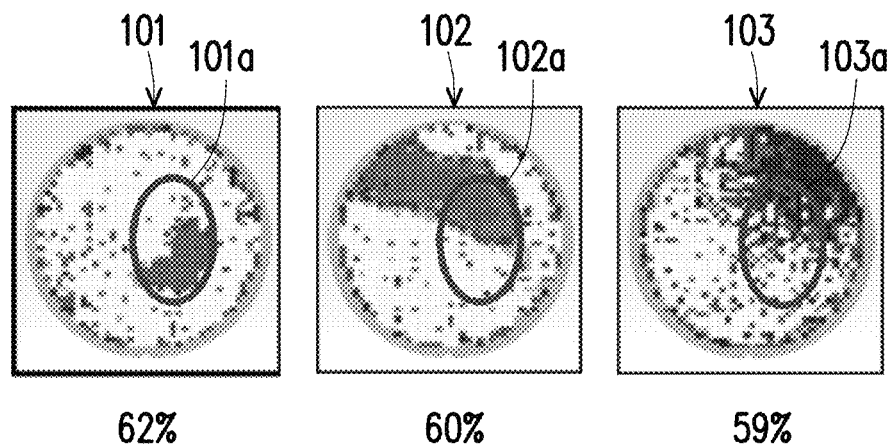
FIG. 1A is a schematic view of a conventional wafer comparison mechanism.
Figure 1B:
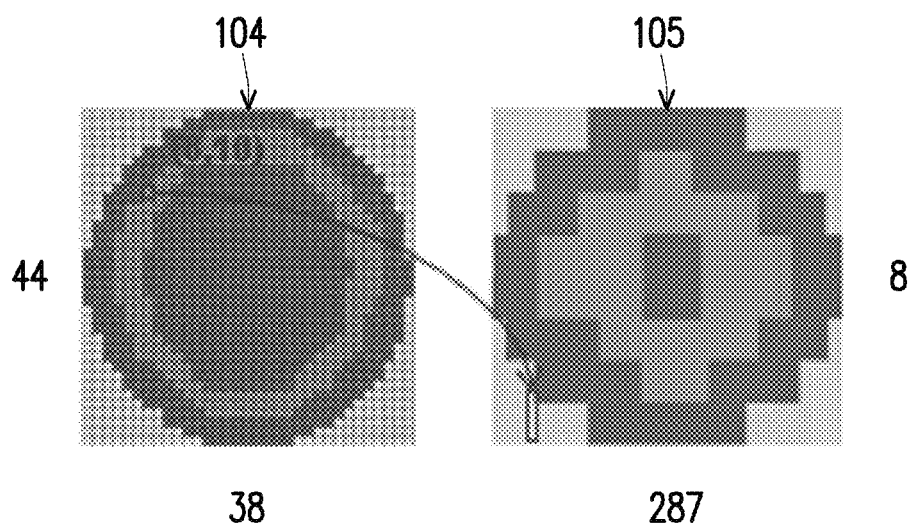
FIG. 1B is a schematic view of die level data of two wafers.
Figure 2:
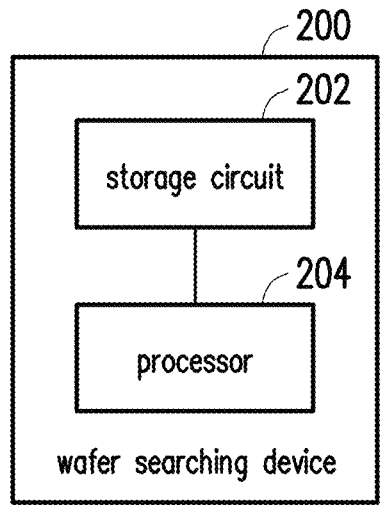
FIG. 2 is a schematic view of a wafer searching device according to an embodiment of the disclosure.

Referring to FIG. 2, FIG. 2 is a schematic view of a wafer searching device according to an embodiment of the disclosure. In different embodiments, a wafer searching device 200 can be implemented as various computer devices and/or smart devices, but the disclosure is not limited thereto.

As shown in FIG. 2, the wafer searching device 200 may include a storage circuit 202 and a processor 204. For example, the storage circuit 202 is any type of fixed or movable random access memory (RAM), read-only memory (ROM), flash memory, hard disk or other similar devices or a combination of the devices, which can be used to record multiple program codes or modules.

The processor 204 is coupled to the storage circuit 202 and can be general purpose processors, special purpose processors, conventional processors, digital signal processors, multiple microprocessors, one or more microprocessors combined with a digital signal processor core, controllers, microcontrollers, application specific integrated circuits (ASICs), field programmable gate arrays (FPGAs), any other types of integrated circuits, state machines, processors based on advanced RISC machine (ARM), and the like.

In the embodiment of the disclosure, the processor 204 can access the modules and program codes recorded in the storage circuit 202 to implement the wafer searching method provided in the disclosure. The details are illustrated as follows.

In the embodiment of the disclosure, for example, the wafer searching device 200 can maintain a wafer database including multiple wafers, and the user can select a wafer to be used as the comparison reference from the wafer database, so that the wafer searching device 200 searches for other similar wafers in the wafer database accordingly. In some embodiments, each wafer in the wafer database may include multiple failed dies and multiple normal dies.

Figure 3:
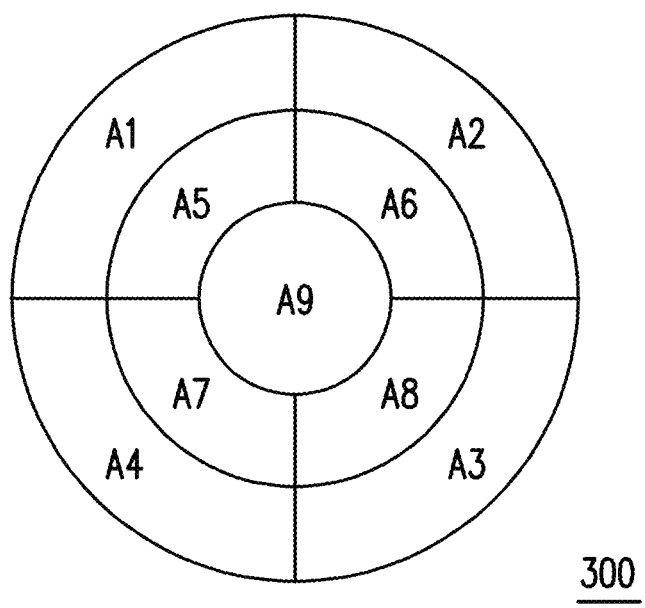
FIG. 3 is a schematic view of a wafer divided into multiple areas according to an embodiment of the disclosure.

In the embodiment of the disclosure, to facilitate the implementation of the proposed wafer searching method, each considered wafer may be divided into multiple areas, as shown in FIG. 3. Referring to FIG. 3, FIG. 3 is a schematic view of a wafer divided into multiple areas according to an embodiment of the disclosure.

As shown in FIG. 3, a wafer 300 can be divided into 9 areas A1 to A9, and in the embodiment of the disclosure, each wafer in the wafer database is divided into multiple areas corresponding to the areas A1 to A9. For ease of description, it is assumed that each considered wafer is divided into areas A1 to A9 in the following paragraphs, but the disclosure is not limited thereto.

In an embodiment, the processor 204 may also pre-estimate the proportion of each failed die in the areas A1 to A9. In some embodiments, for the i-th area (hereinafter referred to as area Ai) in the areas A1 to A9, the processor 204 may calculate the number of failed dies and the total number of dies in the area Ai, and the quotient of the number of the failed dies by the total number of dies is used as the proportion of failed dies in the area Ai, but the disclosure is not limited thereto.

In other embodiments, each wafer in the wafer database may be divided in other ways according to the needs of the designer, and it is not limited to the mode shown in FIG. 3.

Moreover, the processor 204 may also pre-estimate the proportion of failed dies in each area of each wafer for subsequent use.

In some embodiments, the processor 204 may represent each failed die and each normal die of each wafer in normalized coordinates in advance.

Figure 4:
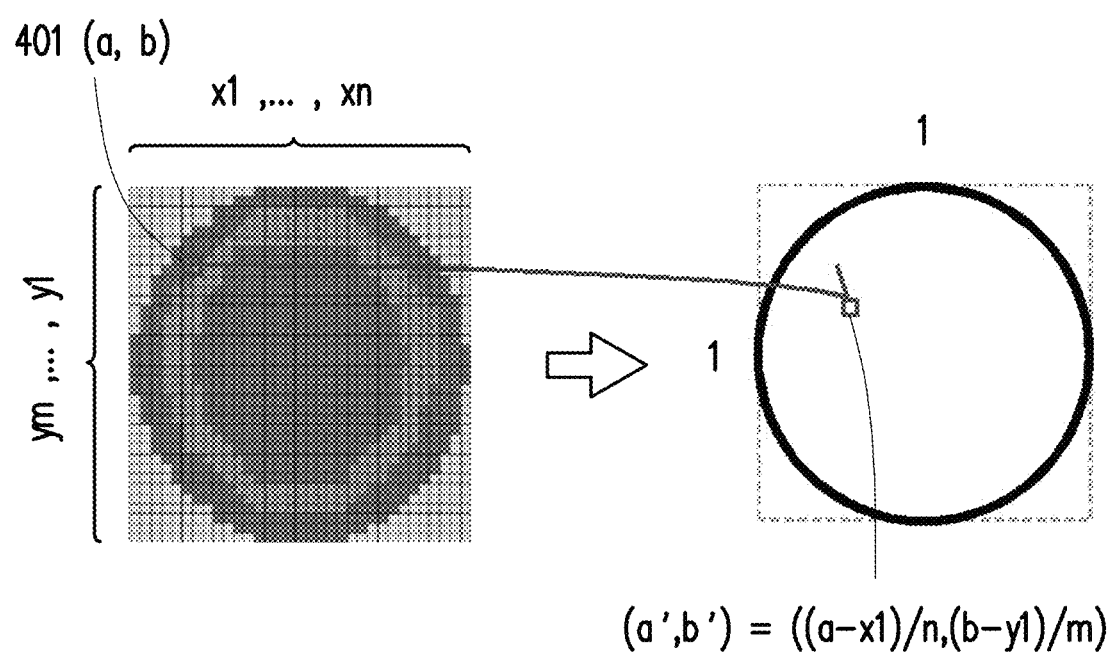
FIG. 4 is a schematic view of a coordinate normalization mechanism according to an embodiment of the disclosure.

Referring to FIG. 4, FIG. 4 is a schematic view of a coordinate normalization mechanism according to an embodiment of the disclosure. In FIG. 4, it is assumed that the horizontal axis of a wafer 400 includes x1 to xn, and the vertical axis includes y1 to ym (n and m are positive integers). Under the assumption, for a die 401 whose coordinates are (a, b) on the wafer 400, the processor 204 can change the coordinates of the die 401 to corresponding normalized coordinates. In FIG. 4, for example, the normalized coordinates of the die 401 can be expressed as (a', b')=((a−x1)/n, (b−y1)/m), but it is not limited thereto. Based on the principle of similarity, the coordinates of each die on each wafer in the wafer database are all represented by the processor 204 with corresponding normalized coordinates.

Figure 5:
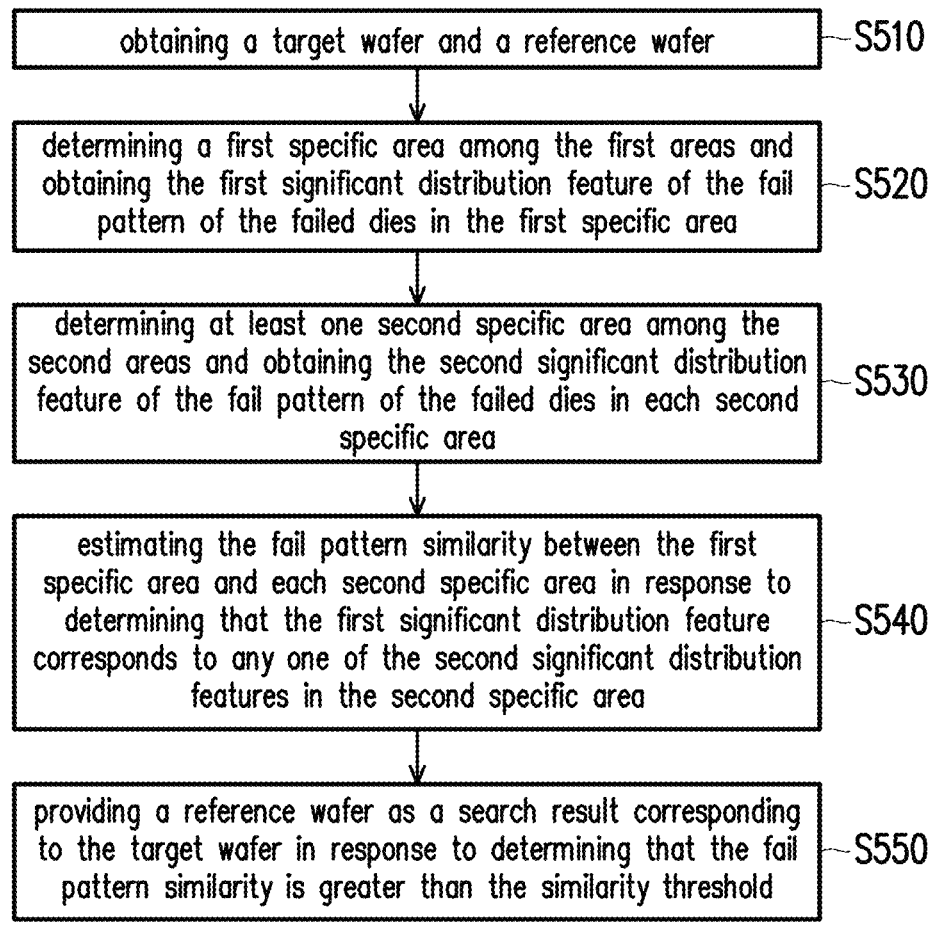
FIG. 5 is a flowchart of a wafer searching method according to an embodiment of the disclosure.

Referring to FIG. 5, FIG. 5 is a flowchart of a wafer searching method according to an embodiment of the disclosure. The method of the embodiment can be executed by the wafer searching device 200 in FIG. 2. The details of each step in FIG. 5 are illustrated with the components shown in FIG. 2 in the following paragraphs.

First, in step S510, the processor 204 can obtain a target wafer and a reference wafer.

In some embodiments, the user can select one or more wafers (hereinafter referred to as selected wafers) in the wafer database, and the processor 204 can then search for one or more wafers in the wafer database as the search result for the user's reference.

In some embodiments, the processor 204 may determine the target wafer based on the one or more selected wafers and compare the target wafer with each wafer in the wafer database, respectively. For ease of description, the wafer used for comparison with the target wafer is referred to as a reference wafer in the following paragraphs, but the disclosure may not be limited thereto.

In different embodiments, the processor 204 may decide to use a single selected wafer as the target wafer or integrate the one or more selected wafers to generate the corresponding target wafer according to the setting of the user.

In one embodiment, for example, the processor 204 may allow the user to determine an area of interest (e.g., the area A1) on the selected wafer, and the area of interest is the area (hereinafter referred to as a first specific area) of the target wafer for comparison with the reference wafer in the subsequent process. Next, the processor 204 may allow the user to determine whether to compare all the areas on the reference wafer with the first specific area respectively (hereinafter referred to as an unlimited area scenario), or to compare only the area whose position on the reference wafer corresponds to the first specific area with the first specific area (hereinafter referred to as a limited area scenario).

In one embodiment, it is assumed that the user selects the area of interest as the area A1. Under the assumption, in the first embodiment (i.e., in the limited area scenario), when the user determines to compare only the area whose position on the reference wafer corresponds to the first specific area (e.g., the area A1 on the reference wafer) with the first specific area in the subsequent process, the processor 204 can generate the corresponding target wafer by integrating the one or more selected wafers.

Specifically, in the first embodiment (i.e., in the limited area scenario), the processor 204 may determine the failed die on the target wafer based on the failed die on each selected wafer. Specifically, in one embodiment, in response to determining that each selected wafer has a failed die located at a specific location, the processor 204 may determine that the target wafer has a failed die located at a specific location. On the other hand, in response to determining that none of the selected wafers has failed die located at a specific location, the processor 204 may determine that the target wafer does not have a failed die located at a specific location.

In other words, the processor 204 can be understood as taking the intersection of the failed die on each selected wafer to determine the failed die on the target wafer. For example, the processor 204 may first create a blank (i.e., the fail/normal condition of all the dies is undecided) as the target wafer. Next, when each selected wafer has a failed die at a certain position, the processor 204 sets the die at the corresponding position on the target wafer as the failed die; when each selected wafer does not have a failed die at a certain position, the processor 204 sets the die at the corresponding position on the target wafer as a normal die, but the disclosure is not limited thereto.

On the other hand, in the second embodiment (i.e., in the unlimited area scenario), when the user determines to compare all the areas on the reference wafer with the first specific area respectively, the processor 204 can select a single wafer as the target wafer to compare with the reference wafer. In the second embodiment, after the comparison is completed, the processor 204 can use another wafer from the selected wafers as the target wafer and compare it with the same reference wafer again, but the disclosure is not limited thereto.

After obtaining the target wafer, the processor 204 may divide the target wafer into multiple areas (hereinafter referred to as the first area) according to the previous description, and the reference wafer may also be divided into multiple areas (hereinafter referred to as the second area) corresponding to the first areas.

Next, in step S520, the processor 204 may determine a first specific area among the first areas and obtain the first significant distribution feature of the fail pattern of the multiple failed dies in the first specific area.

According to the previous description, the processor 204 may determine the first specific area on the target wafer according to the area of interest determined by the user. For example, if the area of interest determined by the user is the area A1 on each selected wafer, the processor 204 uses the area A1 on the selected target wafer as the first specific area; if the area of interest determined by the user is the area A2 on each selected wafer, the processor 204 uses the area A2 on the selected target wafer as the first specific area, but the disclosure is not limited thereto.

In an embodiment, the first significant distribution feature is one of multiple preset distribution features. When the processor 204 obtains the first significant distribution feature of the fail patterns of the failed dies in the first specific area, the processor 204 may first estimate multiple first feature values of the preset distribution feature of the first specific area, which is further illustrated accompanying with FIG. 6 in the following paragraphs.

Figure 6:
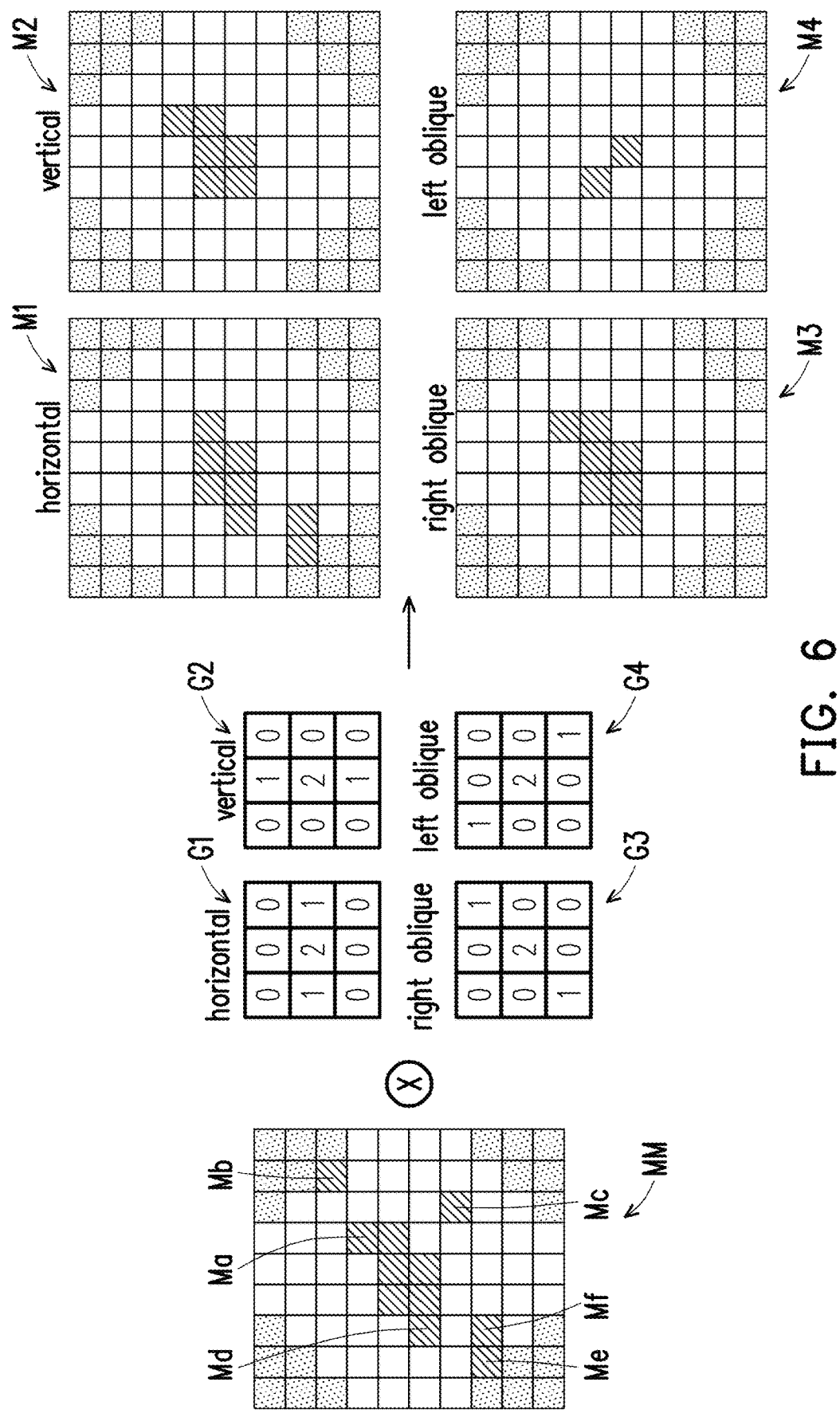
FIG. 6 is a schematic view of estimating the first feature value of each preset distribution feature of the first specific area according to an embodiment of the disclosure.

Referring to FIG. 6, FIG. 6 is a schematic view of estimating the first feature value of each preset distribution feature of the first specific area according to an embodiment of the disclosure. In the embodiment, it is assumed that the first specific area is the i-th first area among the first areas. Under the assumption, the processor 204 can obtain the first die fail ratio (i.e., the quotient of the total number of failed dies in the first specific area by the total number of dies in the first specific area, which is represented by $F_i$) in the first specific area according to the previous teaching.

Next, the processor 204 can characterize the target wafer as a first die distribution matrix MM, the element (shown as a diagonal grid) having the first value (e.g., 1) in the first die distribution matrix MM corresponds to one of the failed dies of the target wafer, and the element (shown as a blank grid) having a second value (e.g., 0) in the first die distribution matrix MM corresponds to one of the normal dies of the target wafer.

In FIG. 6, the preset distribution features considered include horizontal direction features, vertical direction features, right oblique direction features, and left oblique direction features (which may be referred to as the first to fourth preset distribution features, respectively), for example. The preset distribution features may not be limited thereto. In this case, the processor 204 may perform a convolution operation on the first die distribution matrix MM and the j-th feature enhancement matrix of multiple feature enhancement matrices G1 to G4 to generate the j-th reference die distribution matrix of multiple reference die distribution matrices. The j-th feature enhancement matrix corresponds to the j-th preset distribution feature of the preset distribution features.

For example, the processor 204 may perform a convolution operation on the first die distribution matrix MM and the feature enhancement matrix G1 to generate a reference die distribution matrix M1 corresponding to the horizontal direction feature. In other words, the processor 204 can be understood as enhancing the features of the fail pattern of the first die distribution matrix MM in the horizontal direction. For example, the processor 204 may limit the current sum to be greater than or equal to a set threshold (e.g., 3) when the convolution operation is performed on the first die distribution matrix MM and the feature enhancement matrix G1 so that the elements currently used for the convolution operation in the first die distribution matrix MM can be retained in the reference die distribution matrix M1. In this case, in the first die distribution matrix MM, elements, such as Ma, Mb, and Mc, which are discontinuous in the horizontal direction may not be retained in the reference die distribution matrix M1.

Similarly, the processor 204 can perform a convolution operation on the first die distribution matrix MM and the feature enhancement matrix G2 to generate a reference die distribution matrix M2 corresponding to the vertical direction feature. In this case, in the first die distribution matrix MM, elements, such as Mb, Mc, Md, Me, and Mf, which are discontinuous in the vertical direction may not be retained in the reference die distribution matrix M2.

Moreover, the processor 204 may perform a convolution operation on the first die distribution matrix MM and the feature enhancement matrix G3 to generate a reference die distribution matrix M3 corresponding to the right oblique direction feature. In this case, in the first die distribution matrix MM, elements, such as elements Mb, Mc, Me, and Mf, which are discontinuous in the right oblique direction may not be retained in the reference die distribution matrix M3.

Similarly, the processor 204 may perform a convolution operation on the first die distribution matrix MM and the feature enhancement matrix G4 to generate a reference die distribution matrix M4 corresponding to the left oblique direction feature. In this case, in the first die distribution matrix MM, elements which are discontinuous in the left oblique direction may not be retained in the reference die distribution matrix M4.

After the reference die distribution matrices M1 to M4 are obtained, the processor 204 may estimate the number of the j-th failed dies among the number of failed dies based on the element having the first value in the j-th reference die distribution matrix. The number of the j-th failed dies corresponds to the j-th preset distribution feature. In FIG. 6, the number of elements having the first value in the reference die distribution matrix M1 is 8 (i.e., the number of diagonal grids in the reference die distribution matrix M1, so the processor 204 can estimate that the number of failed dies (i.e., the number of the first failed dies) corresponding to the horizontal direction feature (i.e., the first preset distribution feature) is 8. Moreover, the number of elements having the first value in the reference die distribution matrix M2 is 6 (i.e., the number of diagonal grids in the reference die distribution matrix M2), so the processor 204 can estimate that the number of failed dies (i.e., the number of the second failed dies) corresponding to the vertical direction feature (i.e., the second preset distribution feature) is 6. Based on the principle of similarity, the processor 204 can estimate that the number of failed dies with the right oblique direction feature and the left oblique direction feature are 7 and 2, respectively, and the details are not iterated herein.

After obtaining the number of the failed dies corresponding to each preset distribution feature, the processor 204 may estimate the j-th first feature value of the first feature value in the first specific area based on the number of the j-th failed dies and the first die fail ratio in the first specific area. The j-th first feature value corresponds to the j-th preset distribution feature. In an embodiment, the processor 204 may divide the number of the j-th failed dies by the first die fail ratio (i.e., $F_i$) in the first specific area to obtain the j-th first feature value (represented by $P_{ij}$) corresponding to the j-th preset distribution feature.

In FIG. 6, the processor 204 may divide the number of the first failed die (i.e., 8) by $F_i$ to obtain the first first feature value (i.e., $P_{i1}$) corresponding to the horizontal direction feature. Similarly, the processor 204 may divide the number of the second failed die (i.e., 6) by $F_i$ to obtain the second first feature value (i.e., $P_{i2}$) corresponding to the vertical direction feature. Based on the principle of similarity, the processor 204 can obtain $P_{i3}$ and $P_{i4}$ accordingly, and the details are not iterated herein.

After the first feature values (e.g., $P_{i1}$ to $P_{i4}$) of the preset distribution feature in the first specific area are obtained, the processor 204 can search for the first highest feature value among the first feature values and search for one of the preset distribution features of the first specific area corresponding to the first highest feature value to serve as the first significant distribution feature. For example, if the processor 204 determines that $P_{i1}$ is the highest feature value among $P_{i1}$ to $P_{i4}$, the processor 204 may determine that the horizontal direction feature corresponding to $P_{i1}$ is the first significant distribution feature of the first specific area. In another example, if the processor 204 determines that $P_{i2}$ is the highest feature value among $P_{i1}$ to $P_{i4}$, the processor 204 may determine that the vertical direction feature corresponding to $P_{i2}$ is the first significant distribution feature of the first specific area.

Next, in step S530, the processor 204 may determine at least one second specific area among the second areas and obtain the second significant distribution features of the fail pattern of the failed dies in each second specific area.

In the embodiment of the disclosure, the at least one second specific area may be understood as an area in the reference wafer for comparison with the first specific area of the target wafer.

Therefore, in the first embodiment (i.e., the limited area scenario), the processor 204 may search for one of the second areas whose position corresponds to the position of the first specific area as the second specific area. For example, if the first specific area is the area A1 in the target wafer, the processor 204 may select the area A1 in the reference wafer as the second specific area. In other words, if the position of the first specific area is limited to a position corresponding to the second specific area, the processor 204 may search for one of the second areas that corresponds to the position of the first specific area as the second specific area. That is, in the first embodiment, there is only one second specific area in the reference wafer, but the disclosure is not limited thereto.

On the other hand, in the second embodiment (i.e., in the unlimited area scenario), the processor 204 may regard the second areas as the second specific area. In other words, if the position of the first specific area is not limited to the position corresponding to the second specific area, the processor 204 may regard the second areas as the second specific area. That is, in the second embodiment, the number of the second specific areas may be the same as the number of the second areas, but the disclosure may not be limited thereto.

After one or more second specific areas are determined according to the above teachings, the processor 204 can obtain the second significant distribution features of the fail patterns of the failed dies in each second specific area. In an embodiment, the processor 204 may estimate multiple second feature values (represented by $P'_{ij}$) of the preset distribution feature of each second specific area, search for the second highest feature value among the second feature values, and search for one of the preset distribution features of each second specific area corresponding to the second highest feature value to serve as the second significant distribution feature. The way through which the processor 204 obtains the second significant distribution feature of each second specific area is similar to the way through which the processor 204 obtains the first significant distribution feature of the first specific area. Therefore, for relevant details, refer to the description of FIG. 6, which is not iterated herein.

In other embodiments, multiple feature values of the preset distribution feature and the corresponding significant distribution feature of each wafer in the wafer database can be calculated in advance by the processor 204 for direct access after the user determines the selected wafer, and thereby the efficiency of the subsequent processing is facilitated, but the disclosure may not be limited thereto.

For example, in one embodiment, when the first significant distribution feature of the fail pattern of the failed die in the first specific area is obtained, the processor 204 may directly obtain the first feature value of the preset distribution feature of the first specific area from the wafer database, search for the first highest feature value among the first feature values, and search for one of the preset distribution features of the first specific area corresponding to the first highest feature value to serve as the first significant distribution feature, but the disclosure may not be limited thereto. Moreover, when the second significant distribution feature of the fail pattern of the failed die in the second specific area is obtained, the processor 204 may also directly obtain the second feature value of the preset distribution features of the second specific area from the wafer database, search for the second highest feature value among the second feature values, and search for one of the preset distribution features of the second specific area corresponding to the second highest feature value to serve as the second significant distribution feature, but the disclosure may not be limited thereto.

In an embodiment, the processor 204 may determine whether the first significant distribution feature corresponds to any second significant distribution feature in the second specific area.

In the first embodiment (i.e., in the limited area scenario), there is only one second specific area in the reference wafer, so the processor 204 may determine whether the first significant distribution feature of the first specific area and the second significant distribution feature of the second specific area both correspond to one same preset distribution feature. If so, the processor 204 may determine that the first significant distribution feature corresponds to the second significant distribution feature of the second specific area, and if not, the processor 204 may determine that the first significant distribution feature does not correspond to the second significant distribution feature of the second specific area.

For example, if both the first significant distribution feature and the second significant distribution feature are horizontal direction features, the processor 204 may determine that the first significant distribution feature corresponds to the second significant distribution feature of the second specific area. In another example, if the first significant distribution feature and the second significant distribution feature are both vertical direction features, the processor 204 may also determine that the first significant distribution feature corresponds to the second significant distribution feature in the second specific area.

On the other hand, if the first significant distribution feature is a horizontal direction feature, but the second significant distribution feature is a vertical direction feature, a left oblique feature, or a right oblique feature, the processor 204 may determine that the first significant distribution feature does not correspond to the second significant distribution feature of the second specific area, but the disclosure may not be limited thereto.

In the second embodiment (i.e., in the unlimited area scenario), the processor 204 may determine whether the first significant distribution feature and any one of the second significant distribution features in the second specific area both correspond to one same preset distribution feature. If so, the processor 204 may determine that the first significant distribution feature corresponds to any one of the second significant distribution features in the second specific area. On the other hand, if the first significant distribution feature is different from the second significant distribution feature of each second specific area, the processor 204 may determine that the first significant distribution feature does not correspond to any second significant distribution feature of the second specific area.

For example, if the first significant distribution feature is a left oblique direction feature, when any one of the second significant distribution features in the second specific area is a left oblique direction feature, the processor 204 may determine that the first significant distribution feature corresponds to any one of the second significant distribution features of the second specific area. In another example, if the first significant distribution feature is a right oblique direction feature, when any one of the second significant distribution features in the second specific area is a right oblique direction feature, the processor 204 may determine that the first significant distribution feature corresponds to any one of the second significant distribution features of the second specific area.

On the other hand, if the first significant distribution feature is a horizontal direction feature, but the second significant distribution features of each second specific area are not horizontal direction features, the processor 204 may determine that the first significant distribution feature does not correspond to any one of the second significant distribution feature of the second specific area, but the disclosure may not be limited thereto.

Accordingly, in step S540, in response to determining that the first significant distribution feature corresponds to any one of the second significant distribution features in the second specific area, the processor 204 can estimate a fail pattern similarity between the first specific area and each second specific area.

In the embodiment of the disclosure, for the i-th second specific area in the second specific area, the processor 204 may estimate multiple second feature values of the preset distribution features of the i-th second specific area. Next, the processor 204 may estimate the fail pattern similarity between the first specific area and the i-th second specific area with the first feature value ($P_{ij}$) of the first specific area, the second feature value ($P'_{ij}$) of the i-th second specific area, the number (represented by m) of preset distribution features, and the correction parameter (represented by z).

In the first embodiment (i.e., in the limited area scenario), there is only one second specific area in the reference wafer (which can be the i-th second area), so the fail pattern similarity (represented by $S_i$) between the first specific area and the second specific area can be estimated as $S_i = \Sigma_j I_j \times (z - |P_{ij} - P'_{ij}|)/(z \times m)$. In some embodiments, for example, z is a value between 0 and 1 (e.g., 0.2), but the disclosure may not be limited thereto. Moreover, if $|P_{ij} - P'_{ij}| < z$, then $I_j$ is 1; if $|P_{ij} - P'_{ij}| \geq z$, then $I_j$ is 0, but the disclosure is not limited thereto.

In the second embodiment (i.e., in the unlimited area scenario), the fail pattern similarity (represented by $S_i$) between the first specific area and the i-th second specific area (which can be the i-th second area) can be estimated as $S_i = \Sigma_j I_j \times (z - |P_{ij} - P'_{ij}|)/(z \times m)$. In some embodiments, for example, z is a value between 0 and 1 (e.g., 0.2), but the disclosure may not be limited thereto. Moreover, if $|P_{ij} - P'_{ij}| < z$, then $I_j$ is 1; if $|P_{ij} - P'_{ij}| \geq z$, then $I_j$ is 0, but the disclosure is not limited thereto.

After the fail pattern similarity (i.e., $S_i$) between the first specific area and each second specific area is obtained, the processor 204 may determine whether the fail pattern similarity is greater than a similarity threshold (represented by T). In other embodiments, T can be set to any value according to the need of the designer, such as 80, but the disclosure is not limited thereto.

Then, in step S550, in response to determining that the fail pattern similarity is greater than the similarity threshold, the processor 204 may provide a reference wafer as a search result corresponding to the target wafer.

In the first embodiment (i.e., in the limited area scenario), there is only one second specific area in the reference wafer, so the processor 204 may determine whether the $S_i$ corresponding to the second specific area is greater than the similarity threshold. If so, the processor 204 can accordingly provide the reference wafer as the search result corresponding to the target wafer. On the other hand, if it is determined that the $S_i$ corresponding to the second specific area is not greater than the similarity threshold, the processor 204 may not provide the reference wafer as the search result corresponding to the target wafer, but the disclosure is not limited thereto.

In the second embodiment (i.e., in the unlimited area scenario), the processor 204 may determine whether any corresponding Si of the second specific area is greater than the similarity threshold. If so, the processor 204 can accordingly provide the reference wafer as the search result corresponding to the target wafer. On the other hand, if it is determined that the Si corresponding to each second specific area is not greater than the similarity threshold, the processor 204 may provide another selected wafer as a new target wafer, and determine whether to provide the reference wafer as the search result corresponding to the new target wafer according to the above teaching. In short, in the second embodiment, after comparing one selected wafer with the reference wafer, the processor 204 can compare another selected wafer with the same reference wafer to determine whether to provide this reference wafer as the search result corresponding to the another selected wafer, but the disclosure is not limited thereto.

After comparing the target wafer with the reference wafer, the processor 204 can then use other wafers in the wafer database as a new reference wafer and determine whether to provide the new reference wafer as the search result corresponding to the target wafer according to the above teachings, but the disclosure is not limited thereto.

Accordingly, in the method of the disclosure, in the wafer database, one or more wafers having fail patterns similar to those of the target wafer is provided as the search result corresponding to the target wafer, and based on the search result corresponding to the target wafer, the user can perform a subsequent common machine analysis or perform an analysis of variance (ANOVA) or a correlation analysis on the feature values.

Figure 7:
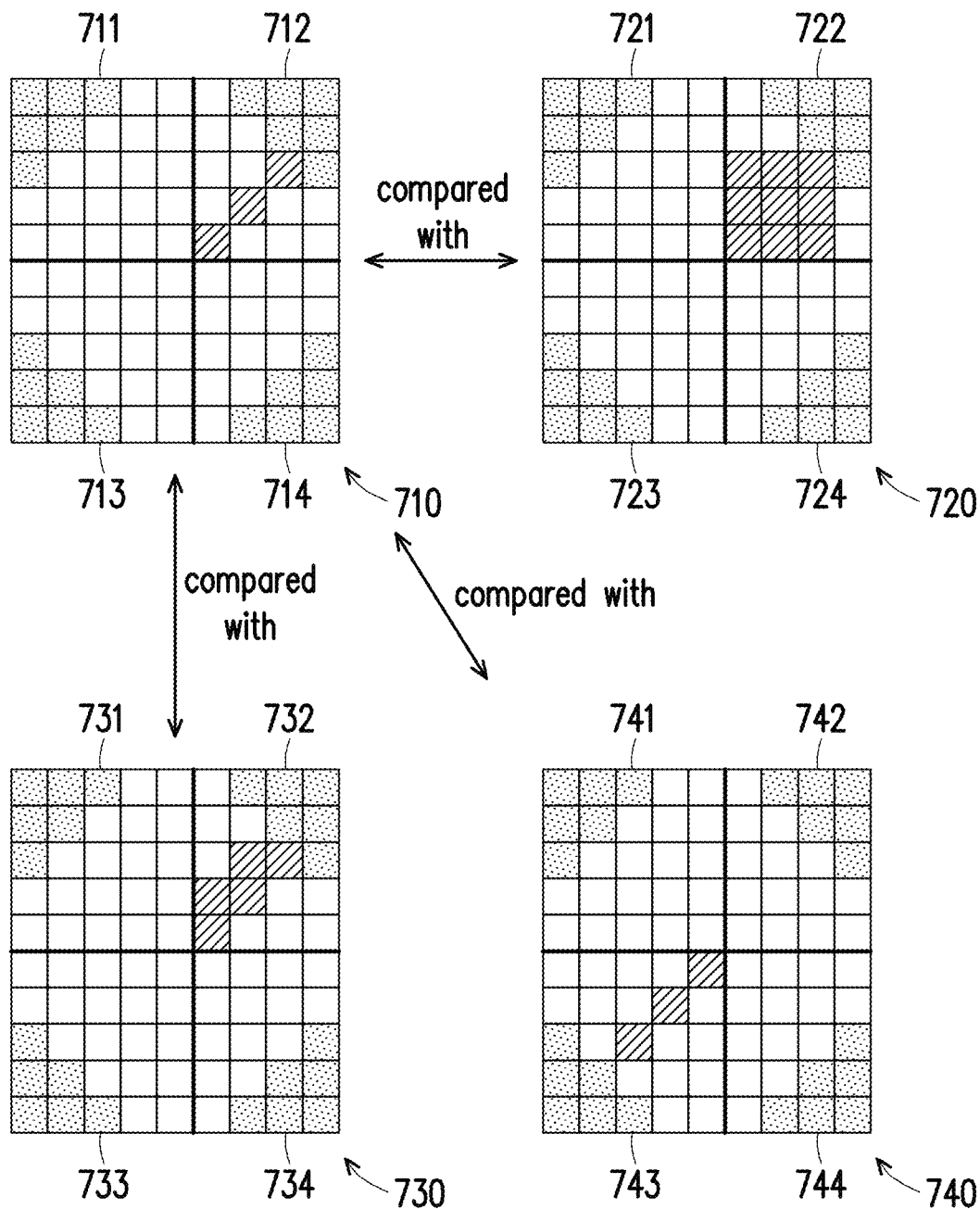
FIG. 7 is a schematic view of wafer comparison according to an embodiment of the disclosure.

For easily understanding the concept of the disclosure, further explanation accompanying with FIG. 7 is illustrated as follows. Referring to FIG. 7, FIG. 7 is a schematic view of wafer comparison according to an embodiment of the disclosure. In FIG. 7, it is assumed that each considered wafer is divided into four corresponding areas. For example, a target wafer 710 may be divided into first areas 711 to 714, a reference wafer 720 may be divided into second areas 721 to 724 corresponding to the first areas 711 to 714, a reference wafer 730 may be divided into second areas 731 to 734 corresponding to the first areas 711 to 714, and a reference wafer 740 may be divided into second areas 741 to 744 corresponding to the first areas 711 to 714, but the disclosure may not be limited thereto.

In FIG. 7, it is assumed that the user selects the first area 712 as the first specific area of the target wafer 710. The user can further decide whether to compare the target wafer 710 with the reference wafers 720, 730, 740, respectively based on the method of the first embodiment (i.e., the limited area scenario) or the method the second embodiment (i.e., the unlimited area scenario).

If the user chooses to adopt the method of the first embodiment (i.e., the limited area scenario), the processor 204 may only select the second area corresponding to the first specific area (i.e., the first area 712) in each reference wafer as the considered second specific area. In this case, in the reference wafer 720, the processor 204 may select the second area 722 whose position corresponds to the first area 712 as the second specific area in the reference wafer 720; in the reference wafer 730, the processor 204 may select the second area 732 whose position corresponds to the first area 712 as the second specific area in the reference wafer 730; and in the reference wafer 740, the processor 204 may select the second area 742 whose position corresponds to the first area 712 as the second specific area in the reference wafer 740.

In FIG. 7, if it is determined that the first significant distribution feature of the first specific area (i.e., the first area 712) is a right oblique direction feature, and the second significant distribution feature of the second specific area (i.e., the second area 732) of the reference wafer 730 is also a right oblique direction feature, then the processor 204 may further estimate the fail pattern similarity between the first specific area (i.e., the first area 712) and the second specific area (i.e., the second area 732) of the reference wafer 730 and then determine whether to provide the reference wafer 730 as the search result corresponding to the target wafer 710. If the fail pattern similarity between the first specific area (i.e., the first area 712) and the second specific area (i.e., the second area 732) of the reference wafer 730 is greater than the similarity threshold, then the processor 204 may provide the reference wafer 730 as the search result corresponding to the target wafer 710 in the first embodiment.

On the other hand, none of the second significant distribution feature of the second specific area (i.e., the second area 722) of the reference wafer 720 and the second significant distribution feature of the second specific area (i.e., the second area 742) of the reference wafer 740 are right oblique direction features, so the processor 204 may not provide the reference wafers 720 and 740 as the search result corresponding to the target wafer 710 in the first embodiment.

Moreover, if the user chooses to adopt the method of the second embodiment (i.e., the unlimited area scenario), the processor 204 may select each second area in each reference wafer as the considered second specific area. In this case, the processor 204 may select the second areas 721 to 724 in the reference wafer 720 as the second specific areas in the reference wafer 720, the second areas 731 to 734 in the reference wafer 730 are selected as the second specific areas in the reference wafer 730, and the second areas 741 to 744 in the reference wafer 740 are selected as the second specific areas in the reference wafer 740.

In FIG. 7, none of the second significant distribution features of the second areas 721 to 724 in the reference wafer 720 are right oblique direction features, so the processor 204 may not provide the reference wafer 720 as the search result corresponding to the target wafer 710 in the second embodiment.

Moreover, the second significant distribution feature of one (i.e., the second area 732) of the second specific areas in the reference wafer 730 is a right oblique direction feature, so the processor 204 can further estimate the fail pattern similarity between the first specific area (i.e., the first area 712) and the second specific area (i.e., the second area 732) of the reference wafer 730, and then determine whether to provide the reference wafer 730 as a search result corresponding to the target wafer 710. If the fail pattern similarity between the first specific area (i.e., the first area 712) and the second specific area (i.e., the second area 732) of the reference wafer 730 is greater than the similarity threshold, then the processor 204 may provide the reference wafer 730 as the search result corresponding to the target wafer 710 in the second embodiment.

Moreover, the second significant distribution feature of one (i.e., the second area 743) of the second specific areas in the reference wafer 740 is also a right oblique direction feature, so the processor 204 can further estimate the fail pattern similarity between the first specific area (i.e., the first area 712) and the second specific area (i.e., the second area 743) of the reference wafer 740, and then determine whether to provide the reference wafer 740 as the search result corresponding to the target wafer 710. If the fail pattern similarity between the first specific area (i.e., the first area 712) and the second specific area (i.e., the second area 743) of the reference wafer 740 is greater than the similarity threshold, then the processor 204 may provide the reference wafer 740 as the search result corresponding to the target wafer 710 in the second embodiment.

In summary, by expressing the dies of each wafer in normalized coordinates, the method of the disclosure can achieve the effect of cross-product comparison. Moreover, compared with the conventional comparison method only based on the fail ratio in a specific area, the disclosure can search for a reference wafer with a fail pattern similar to a fail pattern of the target wafer in a more accurate manner.

Moreover, the amount of the required data acquired during the search is much less than the amount acquired by the conventional method, so the method of the disclosure can achieve better search efficiency. For example, if there are 750 wafers in the wafer database, and the number of dies on each wafer is 3000, the amount of the required data acquired during the search by the conventional method is about 2,250,000 (i.e., 750×3000). However, if the method of the disclosure is adopted, only an amount of 750×m of data is required. If the number of considered preset distribution features is 4, the amount of data required by the method of the disclosure is only about 3000 (i.e., 750×4), which is obviously much less than the amount of data required by the conventional practice.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A wafer searching method adapted for a wafer searching device, wherein the method comprises:
obtaining a target wafer and a reference wafer, wherein a plurality of failed dies and a plurality of normal dies are distributed on the target wafer and the reference wafer, respectively, the target wafer is divided into a plurality of first areas, and the reference wafer is divided into a plurality of second areas corresponding to the first areas;
determining a first specific area in the first areas and obtaining a first significant distribution feature of fail patterns of the failed dies in the first specific area;
determining at least one second specific area in the second areas and obtaining a second significant distribution feature of fail patterns of the failed dies in each second specific area;
in response to determining that the first significant distribution feature corresponds to any one of the second significant distribution features of the at least one second specific area, estimating a fail pattern similarity between the first specific area and the each second specific area;
in response to determining that the fail pattern similarity is greater than a similarity threshold, providing the reference wafer as a search result corresponding to the target wafer.

2. The wafer searching method according to claim 1, wherein the step of obtaining the target wafer comprises:
obtaining at least one selected wafer, wherein a plurality of failed dies and a plurality of normal dies are distributed on each selected wafer;
in response to determining that a position of the first specific area is limited to a position corresponding to the at least one second specific area, determining the fail dies on the target wafer based on the fail dies on each selected wafer.

3. The wafer searching method according to claim 2, wherein the step of determining the failed dies on the target wafer based on the failed dies on each selected wafer comprises:
in response to determining that each selected wafer comprises a failed die located at a specific location, determining that the target wafer comprises the failed die located at the specific location;
in response to determining that any one of the at least one selected wafer does not comprise the failed die located at the specific location, determining that the target wafer does not comprise the failed die located at the specific location.

4. The wafer searching method according to claim 1, wherein the step of obtaining the target wafer comprises:
obtaining at least one selected wafer, wherein a plurality of failed dies and a plurality of normal dies are distributed on each selected wafer;
in response to determining that a position of the first specific area is not limited to a position corresponding to the at least one second specific area, using one of the at least one selected wafer as the target wafer.

5. The wafer searching method according to claim 4 further comprises:
in response to determining that the fail pattern similarity is not greater than the similarity threshold, using another of the at least one selected wafer as the target wafer and determining whether to provide the reference wafer as the search result corresponding to the target wafer.

6. The wafer searching method according to claim 1, wherein the first significant distribution feature is one of a plurality of preset distribution features, and the step of obtaining the first significant distribution feature of the fail patterns of the failed dies in the first specific area comprises:
estimating a plurality of first feature values of the preset distribution features of the first specific area;
searching for a first highest feature value among the first feature values and searching for one of the preset distribution features of the first specific area corresponding to the first highest feature value as the first significant distribution features.

7. The wafer searching method according to claim 6, wherein the first specific area is an i-th first area among the first areas, and the step of estimating the first feature values of the preset distribution features of the first specific area comprises:
estimating a first die fail ratio in the first specific area based on the failed dies and the normal dies in the first specific area;
characterizing the target wafer as a first die distribution matrix, wherein an element with a first value in the first die distribution matrix corresponds to one of the failed dies of the target wafer, and an element with a second value in the first die distribution matrix corresponds to one of the normal dies of the target wafer;

performing a convolution operation on the first die distribution matrix and a j-th feature enhancement matrix of a plurality of feature enhancement matrices to generate a j-th reference die distribution matrix among a plurality of reference die distribution matrices, wherein the j-th feature enhancement matrix corresponds to a j-th preset distribution feature among the preset distribution features;

estimating a number of j-th failed dies among a number of the failed dies based on an element with the first value in the j-th reference die distribution matrix, wherein the number of the j-th failed dies corresponds to the the j-th preset distribution feature;

estimating a j-th first feature value among the first feature values of the first specific area based on the number of the j-th failed dies and the first die fail ratio in the first specific area, wherein the j-th first feature value corresponds to the j-th preset distribution feature.

8. The wafer searching method according to claim 6, wherein the target wafer is obtained from a wafer database, the first significant distribution feature is one of a plurality of preset distribution features, and the step of obtaining the first significant distribution feature of the fail patterns of the failed dies in the first specific area comprises:

obtaining a plurality of first feature values of the preset distribution features of the first specific area from the wafer database;

searching for a first highest feature value among the first feature values and searching for one of the preset distribution features of the first specific area corresponding to the first highest feature value as the first significant distribution feature.

9. The wafer searching method according to claim 1, wherein the step of determining the at least one second specific area among the second areas comprises:

in response to determining that a position of the first specific area is not limited to a position corresponding to the at least one second specific area, regarding the second areas as the at least one second specific area;

in response to determining that a position of the first specific area is limited to a position corresponding to the at least one second specific area, searching for one of the second areas whose position corresponds to a position of the first specific area as the at least one second specific area.

10. The wafer searching method according to claim 1, wherein the second significant distribution feature is one of a plurality of preset distribution features, and the step of obtaining the second significant distribution feature of the fail patterns of the failed dies in the at least one second specific area comprises:

estimating a plurality of second feature values of the preset distribution features of each second specific area;

searching for a second highest feature value among the second feature values and searching for one of the preset distribution features of the each second specific area corresponding to the second highest feature value to serve as the second significant distribution feature.

11. The wafer searching method according to claim 1, wherein the reference wafer is obtained from a wafer database, the second significant distribution feature is one of a plurality of preset distribution features, and the step of obtaining the second significant distribution feature of the fail patterns of the failed dies in the at least one second specific area comprises:

obtaining a plurality of second feature values of the preset distribution features of the each second specific area from the wafer database;

searching for a second highest feature value among the second feature values, and searching for one of the preset distribution features of the each second specific area corresponding to the second highest feature value to serve as the second significant distribution feature.

12. The wafer searching method according to claim 1, wherein in response to determining that the first significant distribution feature and any one of the second significant distribution features in the at least one second specific area both correspond to one same preset distribution feature of a plurality of preset distribution features, it is determined that the first significant distribution feature corresponds to the any one of the second significant distribution features in the at least one second specific area.

13. The wafer searching method according to claim 1, wherein each of the failed dies and each of the normal dies of the target wafer and the reference wafer comprise normalized coordinates.

14. The wafer searching method according to claim 1, wherein the step of estimating the fail pattern similarity between the first specific area and the each second specific area comprises:

estimating a plurality of first feature values of a plurality of preset distribution features of the first specific area;

for the i-th second specific area in the at least one second specific area, estimating a plurality of second feature values of the preset distribution features of the i-th second specific area; and estimating the fail pattern similarity between the first specific area and the i-th second specific area based on the first feature values of the first specific area, the second feature values of the i-th second specific area, a number of the preset distribution features, and a correction parameter.

15. The wafer searching method according to claim 1, further comprising:

in response to determining that the fail pattern similarity is not greater than the similarity threshold, not providing the reference wafer as the search result corresponding to the target wafer.

16. A wafer searching device, comprising:

a storage circuit for storing a program code; and a processor coupled to the storage circuit and accessing the program code for executing the following:

obtaining a target wafer and a reference wafer, wherein a plurality of failed dies and a plurality of normal dies are distributed on the target wafer and the reference wafer, respectively, the target wafer is divided into a plurality of first areas, and the reference wafer is divided into a plurality of second areas corresponding to the first areas;

determining a first specific area in the first areas and obtaining a first significant distribution feature of fail patterns of the failed dies in the first specific area;

determining at least one second specific area in the second areas and obtaining a second significant distribution feature of fail patterns of the failed dies in each second specific area;

in response to determining that the first significant distribution feature corresponds to any one of the second significant distribution features of the at least one second specific area, estimating a fail pattern similarity between the first specific area and the each second specific area;

in response to determining that the fail pattern similarity is greater than a similarity threshold, providing the reference wafer as a search result corresponding to the target wafer.

* * * * *